(12) United States Patent
Trantham (10) Patent No.: US 9,430,329 B2
(45) Date of Patent: Aug. 30, 2016

(54) DATA INTEGRITY MANAGEMENT IN A DATA STORAGE DEVICE

(71) Applicant: Seagate Technology LLC, Cupertino (CA)

(72) Inventor: Jon David Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 88 days.

(21) Appl. No.: 14/244,194

(22) Filed: Apr. 3, 2014

(65) Prior Publication Data

US 2015/0286524 A1 Oct. 8, 2015

(51) Int. Cl.
*G06F 11/10* (2006.01)
*G06F 11/22* (2006.01)
*G11C 29/52* (2006.01)
*G06F 12/02* (2006.01)

(52) U.S. Cl.
CPC ......... *G06F 11/108* (2013.01); *G06F 11/1004* (2013.01); *G06F 11/2289* (2013.01); *G11C 29/52* (2013.01); *G06F 12/0246* (2013.01); *G06F 2212/1032* (2013.01); *G06F 2212/1052* (2013.01); *G06F 2212/7207* (2013.01)

(58) Field of Classification Search
CPC ............. G06F 11/1072; G06F 11/108; G06F 11/2289; G11C 29/52
See application file for complete search history.

(56) References Cited

U.S. PATENT DOCUMENTS

| | | | | |
|---|---|---|---|---|
| 5,440,708 A * | 8/1995 | Takagi | ................ | G06F 13/1668 711/208 |
| 5,761,677 A * | 6/1998 | Senator | ................ | G06F 11/1435 |
| 5,835,601 A * | 11/1998 | Shimbo | ................... | G06F 17/24 380/29 |
| 6,964,008 B1 * | 11/2005 | Van Meter, III | .... | G06F 11/1004 714/766 |
| 7,003,621 B2 * | 2/2006 | Koren | .................. | G11C 16/102 365/185.33 |
| 7,360,039 B2 * | 4/2008 | De Jong | .................... | G06F 8/65 707/999.202 |
| 8,255,617 B2 * | 8/2012 | Goss | ................... | G06F 12/0253 711/103 |
| 8,364,886 B2 * | 1/2013 | Goss | ................... | G06F 12/0246 711/103 |
| 8,397,101 B2 * | 3/2013 | Goss | ................... | G06F 11/1004 711/209 |
| 8,533,170 B1 * | 9/2013 | McHugh | ............. | G06F 17/3023 707/695 |
| 2006/0271725 A1 * | 11/2006 | Wong | ................... | G06F 12/0246 711/103 |
| 2009/0248758 A1 * | 10/2009 | Sawai | ..................... | G01C 21/32 |
| 2010/0121821 A1 * | 5/2010 | Kinoshita | .............. | G06Q 30/06 707/661 |
| 2010/0325363 A1 * | 12/2010 | Olesen | ................ | G06F 12/0815 711/135 |
| 2011/0231736 A1 * | 9/2011 | Toops | ................. | G06F 11/1016 714/768 |
| 2013/0232122 A1 * | 9/2013 | Fitzgerald | ................. | G06F 8/60 707/679 |
| 2013/0326114 A1 * | 12/2013 | Goss | ................... | G06F 12/0246 2/246 |
| 2014/0115261 A1 * | 4/2014 | Maybee | .............. | G06F 12/0897 711/136 |
| 2014/0229790 A1 * | 8/2014 | Goss | ................. | H03M 13/2906 714/755 |

\* cited by examiner

*Primary Examiner* — Jared Rutz
*Assistant Examiner* — Khoa D Doan
(74) *Attorney, Agent, or Firm* — Hall Estill Attorneys at Law (57) ABSTRACT

Apparatus and method for data integrity management in a data storage device. In accordance with some embodiments, a controller transfers user data blocks between a host device and a main memory. Each user data block has an associated logical address. A data integrity manager generates and stores a verification code for each user data block in a table structure in a local memory. The data integrity manager uses the verification code to independently verify a most current version of a selected user data block is being retrieved by the controller from the main memory during a host read request.

20 Claims, 9 Drawing Sheets

DATA INTEGRITY MANAGEMENT IN A DATA STORAGE DEVICE

SUMMARY

Various embodiments of the present disclosure are generally directed to data integrity management in a data storage device.

In some embodiments, a controller transfers blocks of user data (e.g., sectors) between a host device and a main memory. Each user data block has an associated logical address. An independent data integrity manager generates and stores a verification code for each user data block in a table structure in a local memory. The data integrity manager uses the verification code to independently verify a most current version of a selected user data block is being retrieved by the controller from the main memory during a host read request.

In further embodiments, an input user data block is received for storage to a main memory, the user data block having an associated logical address. A verification code is generated responsive to a user data content of the input user data block and the associated logical address. The verification code is stored in a table structure in a local memory and the input user data block is stored in the main memory. A host read request is subsequently received which requests retrieval of the input user data block from the main memory. The verification code is retrieved from the table structure in the local memory, and the retrieved verification code is used to independently verify a most current version of a selected user data block is being retrieved by a controller from the main memory responsive to the host read request.

These and other features which characterize various embodiments of the present disclosure can be understood in view of the following detailed discussion and the accompanying drawings.

DETAILED DESCRIPTION

The present disclosure relates to data storage devices, and in particular to methods and devices that manage different versions of data in a data storage device.

Data storage devices generally operate to store addressable blocks (e.g., sectors) of data in memory. The devices can employ data management systems to track the physical locations of the blocks so that the blocks can be subsequently retrieved responsive to a read request for the stored data.

Some types of data storage devices are configured to write data having a given logical address (e.g., logical block address, LBA) typically to a new available physical memory location each time a block is presented for writing. Such devices are referred to herein as having a virtual memory address mapping scheme. These devices often have electronically "erasable" memories and can include solid state drives (SSDs) with erasable solid state memory (e.g., flash). Virtually-mapped devices can also include some hard disc drives (HDDs), for instance hybrid hard drives, and can also include HDDs that cache data in various locations, such as those that employ rotatable media with shingled (partially overlapping) tracks.

A situation may arise over time where several versions of a given logical block (sector) persist in memory, with one of the versions being the most current data and the remaining versions being older, stale data. Metadata can be generated and maintained to track the locations and status of the stored data, including pointers that point to the locations where the most current versions of the blocks are stored.

While such metadata-based revision control schemes are generally operable to maintain an accurate status of the memory, errors can occur from time to time due to a variety of factors including loss or corruption of the stored metadata, failures in the circuitry used to access the metadata, firmware bugs, incomplete updates of the metadata during a power failure, etc. In some cases, an error condition may cause an older version of data to be returned to the host, rather than the most current version.

Other forms of data storage devices generally overwrite an older version of data with a newer, updated version in the same location. Such devices are referred to herein as having a fixed memory address mapping scheme, and can include devices with "rewritable" memories such as non-shingled (traditional) HDDs, and solid-state devices with rewritable non-volatile memory such a spin-torque transfer random access memory (STRAM), resistive random access memory (RRAM), ferromagnetic random access memory (FeRAM), non-volatile static random access memory (SRAM or NvS-RAM), battery-backed dynamic random access memory (DRAM) and SRAM, etc.

In these and other types of devices, a given physical block address (PBA) may be assigned a particular logical block address (LBA), so that each time a new version of a given block (LBA) is presented to the storage device, the new version is overwritten onto the then-existing older version. This usually results in a situation where there is only a single version of any particular LBA in the memory at a time.

Nevertheless, this scheme can also sometimes result in improper revision retrieval errors. An error condition sometimes referred to as a "ghosting failure" can arise in such devices when a write operation does not write a new version of data to an intended location, thereby leaving an older version of data intact in that location. A data integrity value (hereinafter sometimes referred to as a verification code) can be formed to verify the data write operation. The verification code may be based on a combination of the stored data and other identifying information, such as an LBA value. It can be seen that a verification operation such as a read verify operation that operates using the verification code may signal a successful write operation when, in fact, the new version of data was not written at all.

Accordingly, various embodiments of the present disclosure are generally directed to an apparatus and method for enhancing data integrity. The data integrity schemes disclosed herein are suitable for use in any number of different types of memories, including memories that write new versions of data to different locations in the memory or to the same locations in the memory. The data integrity schemes disclosed herein assist in detecting and resolving a variety of error conditions such as, but not limited to, metadata errors and ghosting failures.

The various embodiments generally operate to ensure that a most current version of data are returned in response to a data request. In some embodiments, a verification code is generated in response to the receipt of input data from a host to be stored to a memory. The verification code is stored in a table structure, and separately used to verify the revision status of the requested memory.

In some cases, the verification code takes the form of a so-called IOEDC (input/output error detection code) value which is formed by summing the data in a selected block and combining (such as via an exclusive-or, XOR) the summed data with a logical address (e.g., LBA) associated with the selected block. Any number of other forms of verification codes can be used.

In further cases, a first portion (such as the most significant byte, MSB) of the verification code are stored in the table structure and a second portion (such as the least significant byte, LSB) of the verification code are stored in the memory. Alternatively, a complete copy of the verification code is stored both in the table and in the memory. In still other embodiments, a copy of the verification code is stored only in the table and not in the memory.

A data integrity manager arranges a data integrity table as a hierarchical structure. Groups of verification codes for logical blocks of user data are combined into pages, with each page storing the verification codes (or portions thereof) for the logical blocks (e.g., LBAs) assigned to that page. Each page is further provided with a higher level verification code with error detection and correction (EDC) capabilities.

Groups of pages may be accumulated into so-called "parent" pages, with each parent page storing the page level EDC codes for the individual pages. Each parent page may also have a higher level verification code in the form of an EDC code. Finally, a master page is generated for the parent pages to store the EDC codes for the individual parent pages. The master page is also provided with a master verification code.

In this way, the various codes can be used during data retrieval and loading operations to verify the individual verification codes for individual LBAs. Data read and write operations can thereafter be carried out by the normal controller path (e.g., main controller firmware) of the system, and the data integrity manager can operate as an independent auditor of the data flow.

Figure 1:
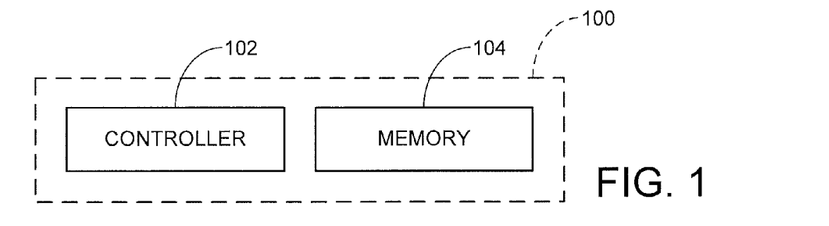
FIG. 1 is a functional block representation of a data storage device which operates in accordance with various embodiments of the present disclosure.

These and other aspects of the various disclosed embodiments can be understood beginning with a review of FIG. 1 which shows an exemplary data storage device 100. The storage device 100 includes a controller 102 and a memory module 104.

The controller 102 provides top-level control and communication functions as the device 100 interacts with a host device (not separately shown) to store and retrieve host user data. It will be appreciated that the controller of a data storage device is often relatively complex and may contain thousands or millions of logic gates. The memory module 104 provides non-volatile storage of the host data. It will be appreciated that a number of additional circuits may be incorporated into the storage device 100 such as an input/output (I/O) communications circuit, one or more data buffers, a hierarchical cache structure, read/write drivers, local dynamic random access memory (DRAM), on-the-fly ECC generating circuitry, etc.

The controller 102 may be a programmable CPU processor that operates in conjunction with programming stored in a computer memory within the device 100. The controller 102 may alternatively be realized in hardware, or the controller functionality may be physically incorporated into the memory module 104.

Figure 2:
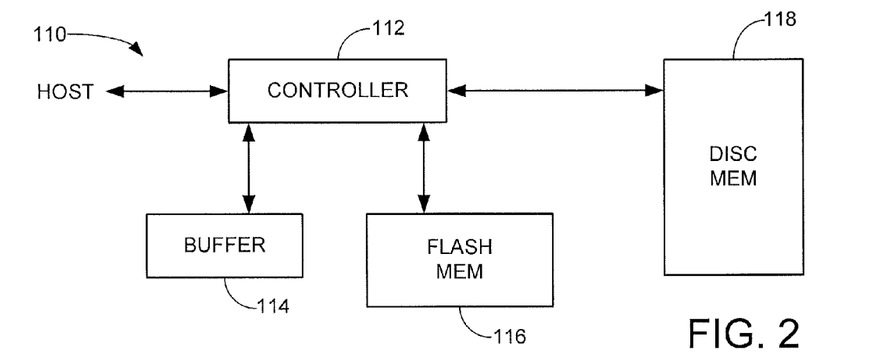
FIG. 2 is a functional block representation of another data storage device in accordance with some embodiments.

FIG. 2 is a functional block diagram for another data storage device 110 in accordance with some embodiments. The device 110 includes a controller 112, a buffer 114, a flash memory module 116 and a disc memory 118. As before, other modules can be included as required.

The controller 112 carries out top level control functions for the device 110 as in FIG. 1. The buffer 114 may be volatile or non-volatile and provides temporary storage of host data during data transfer (read/write) operations, as well as storage of programming steps (e.g., loaded controller firmware) used by the controller 112.

The flash memory module 116 provides erasable non-volatile flash memory cells for the storage of user data, firmware, and system parameters (e.g., metadata, etc.). The flash memory cells can be arranged in a NOR configuration (NOR flash), a NAND configuration (NAND flash), or both. The disc memory 118 comprises one or more rotatable magnetic recording media accessed by a corresponding array of read/write transducers.

The device 110 is characterized as a hybrid drive, so that higher priority user data blocks can be stored in the relatively faster access flash memory module 116 and lower priority user data blocks can be stored in the relatively slower access disc memory 118.

It will be appreciated that a "regular" HDD can have a similar configuration as that set forth by FIG. 2 apart from the flash memory module 116, and an SDD can have a similar configuration as set forth by FIG. 2 by omitting the disc memory 118. Other memory configurations can include a rewritable memory module (e.g., STRAM, RRAM, PCM, FeRAM, a mixture of these and/or other types of solid state memory, etc.) used alone or in conjunction with either or both the flash and disc memory modules 116, 118. FIGS. 1-2 thus illustrate a wide variety of different types of memories that can be managed in accordance with the present disclosure.

In these and other forms of devices, multiple versions (revision levels) of blocks (e.g., sectors) having the same logical block address (LBA) can be stored in different physical memory locations. For example, at different times during operation of the device 110 in FIG. 2, different versions of the same user data block may be stored in the buffer 114, the flash memory module 116 and/or the disc memory 118. Similarly, multiple versions of the same block can be stored in different locations within the same memory device (e.g., multiple versions in the flash memory module 116, etc.).

Figure 3:
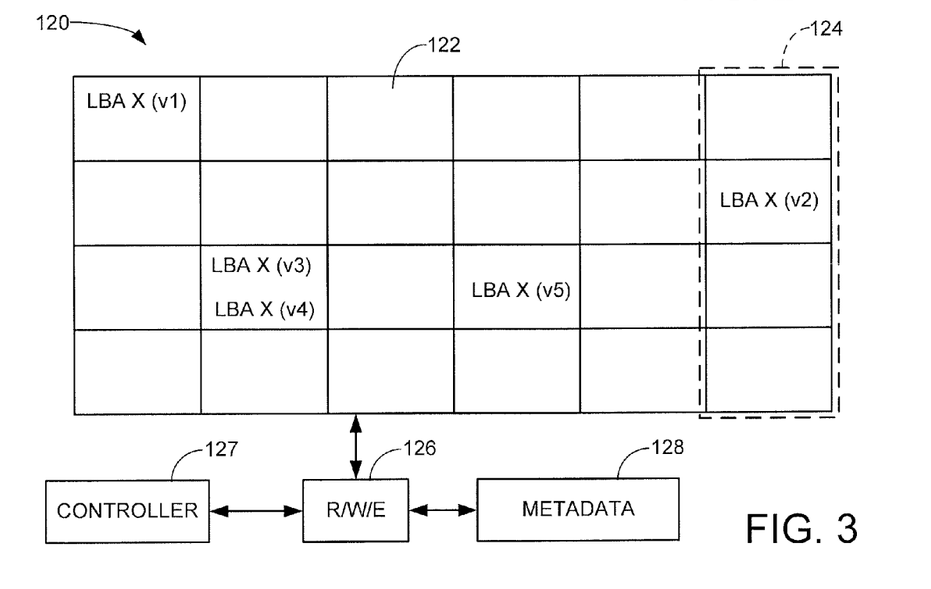
FIG. 3 depicts a flash memory module operable in accordance with some embodiments.

FIG. 3 shows a logical representation of a portion of a flash memory module 120 generally similar to the flash memory module 116 in FIG. 2. The module 120 utilizes flash memory cells arranged in a NAND configuration accessible by various control lines (not separately shown). The memory cells are arranged into a number of erasure blocks 122. The blocks 122 represent the smallest increment of memory cells that can be erased at a time. A plural number of the blocks 122 may be arranged into larger, multi-block garbage collection units (GCUs, one of which is represented at 124) which are erased and allocated as a unit.

Each block 122 has a selected number of rows of memory cells. Data are stored to the rows in the form of pages. An exemplary erasure block size may be on the order of 128 rows, with each row storing 8192 bytes. Other sizes and arrangements of the erasure blocks 122 can be used.

Read, write and erase (R/W/E) operations are carried out upon the memory 120 by an R/W/E circuit 126, which communicates with a device controller 127. Metadata may be sequentially loaded to a metadata table 128 in an adjacent volatile memory (e.g., DRAM) 128 for use during read/write/erase operations to track the status and locations of data.

Because the exemplary flash memory cells in FIG. 3 need to be erased before new data can be written thereto, it is common for R/W/E circuits such as 126 to write updated versions of blocks that share a common LBA value in different locations within the memory 120. Each time the host provides a write command to write a new successive version of a selected block, the device writes the data to a next available page within the memory 120.

The most recently stored version of the block represents the "current" data, and all previously stored versions constitute older "stale" data. The metadata utilizes forward pointers to (normally) enable the system to locate the current version of the data responsive to a read request for a particular LBA. This is illustrated in FIG. 3 for a selected block having the logical address LBA X, of which five different versions have been stored to the memory 120.

Version 5 (v5) represents the current, most recently stored version of the block data for LBA X, and the metadata will ideally point to this location. That is, under normal conditions the v5 data will be returned to the host responsive to a read request for LBA X. The remaining versions v1-v4 represent older, stale data for LBA X, and will be ignored during a read operation for the block. It will be appreciated that the different versions of LBA X may store different data sets, with each later occurring versions having been modified as compared to each earlier successive version such as by a host application. This is not necessarily required, though, as different versions of a given block in the memory may store the same user data.

Garbage collection operations are periodically carried out by the device 120 to reclaim GCUs 124 that store stale data. Garbage collection operations take place in the background and may be scheduled at appropriate times, such as during idle periods with low host I/O activity or when the amount of free pages available for storage falls below a selected threshold. When most or all of the data in a selected GCU 124 are determined to be stale, the garbage collection process will migrate current data to a new GCU, erase the selected GCU, update metadata, and place the erased GCU back into an allocation pool of available blocks. Any current data in the block will be copied to a newly allocated block prior to the erasure operation. Multiple GCUs may be grouped together and concurrently subjected to an erasure operation as desired.

While ongoing garbage collection operations will tend to remove older, stale versions of a given block, it is contemplated that several versions of at least some blocks may persistent in the memory 120 at any given time. This is particularly likely to occur with relatively higher priority data ("hot" data) which are subject to a relatively higher number of write and/or read access operations over a given time interval.

As noted above, a problem can thus arise when the memory 120 of FIG. 3, or any of the other exemplary memories discussed FIGS. 1-2, stores multiple versions of a given block and the metadata (or other data management scheme) does not correctly point to the most current version of the block. For example, with reference again to FIG. 3, the metadata table may identify the latest metadata entry for LBA X to be that corresponding to version 4 (v4), rather than the most current version 5 (v5). In such case, the R/W/E circuit 126 may improperly return the older v4 data rather than the most current v5 data to the host.

Figure 4:
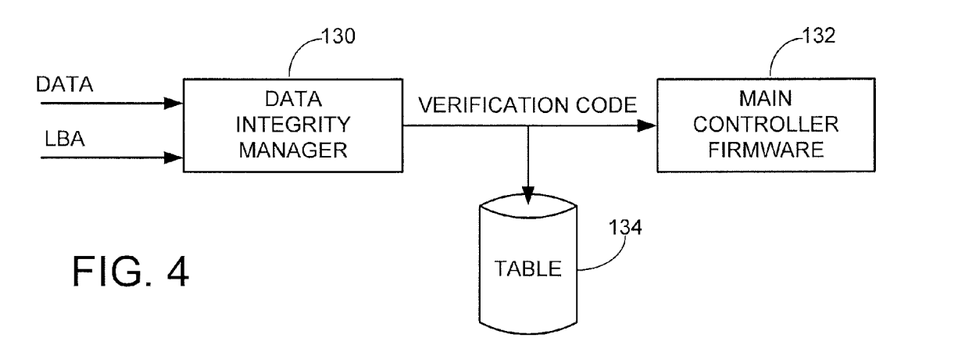
FIG. 4 is a data integrity manager which generates and stores verification codes in support of a data integrity scheme in accordance with various embodiments.

To reduce the occurrence of these and other types of data integrity errors, various embodiments of the present disclosure incorporate the use of a data integrity manager 130, as generally depicted in FIG. 4. The data integrity manager 130 can be realized in hardware or software (e.g., firmware), and generally operates as explained below to provide revision verification during data transfer operations. In some embodiments, the manager 130 forms a portion of the programming used by the device controller, but is a separate module from and operates independently of the rest of the controller code (referred to herein as the main controller firmware 132).

Data for a selected block to be written to a memory is supplied to the data integrity manager 130 along with the associated logical address (e.g., LBA). The manager 130 generates a verification code (VC) for processing by the main controller firmware 132. The manager 130 further forwards the verification code to a table structure in a separate memory 134.

Figures 5, 6:
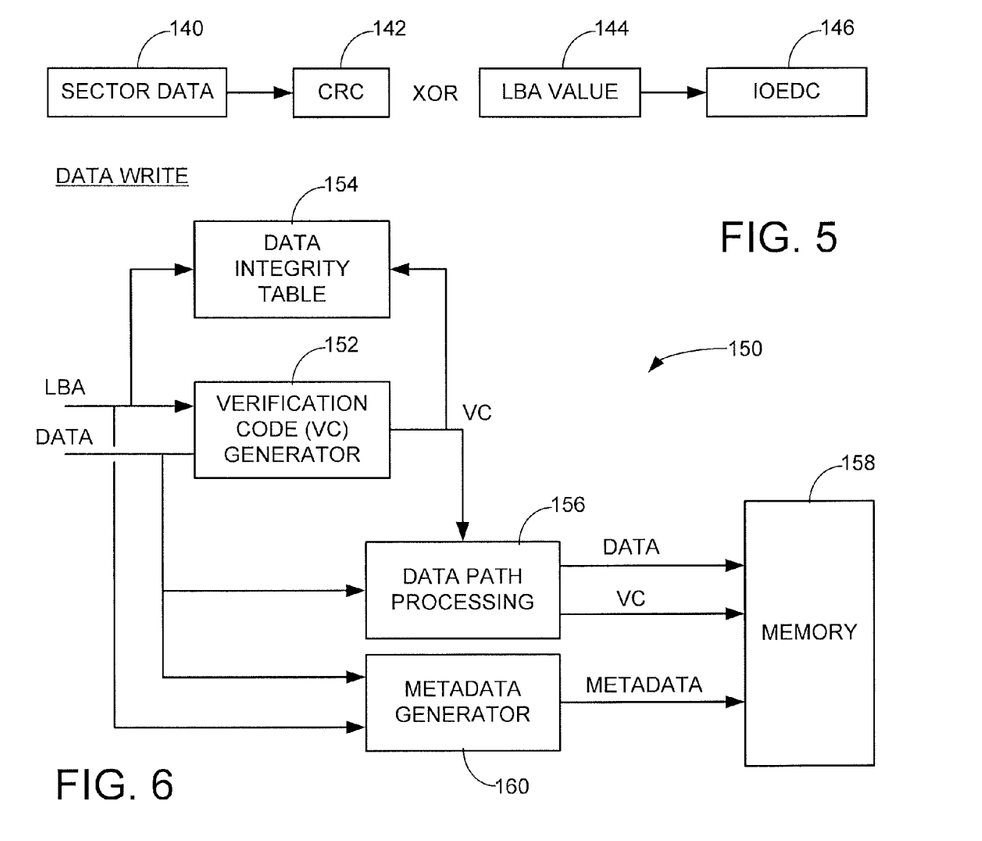
FIG. 5 illustrates generation of a verification code characterized as an IOEDC (input/output error detection code) value.
FIG. 6 is a functional block representation illustrating steps carried out by the data integrity manager during a data write operation.

In some cases, the verification code can take the form of an IOEDC (input/output error detection code). An IOEDC can be generated as illustrated in FIG. 5. Block data 140 having a particular LBA value are provided from a host device for storage. The block data 140 are temporarily stored in a local cache. The data may constitute a selected number of bytes, such as 512 bytes, 4096 bytes, etc.

A data error detecting code, such as a Cyclical Redundancy Code (CRC) value 142 can be generated by convolving together the individual 8-bit bytes of the input block data. The CRC 142 is combined using a suitable combinatorial logic function, such as an exclusive-or (XOR), with a convolved LBA value 144 to generate the IOEDC value. In some embodiments, the LBA value 144 is a hash of the logical block address number for the block, the hash algorithm being used with the same width (in bits) as the IOEDC value. Alternatively, the input block data 140 may be directly CRCed together with the logical block address or LBA value 144 to generate the IOEDC value. It will be appreciated that other types of code values can be used.

The IOEDC is an LBA seeded Error Detecting Code that convolves the sector's logical address with the data to provide a level of error detection and correction for the data. It is contemplated that the IOEDC value 144 in FIG. 5 will be 2 bytes (16 bits) in length, although other sizes can be used.

Referring again to FIG. 3, it will be noted that the IOEDC values for each of the five versions of LBA X will be different in relation to differences among the associated block data, but the LBA component in each IOEDC value will be the same. Thus, extracting the LBA seeded value from each of these IOEDC codewords will all produce the same LBA value, which is useful in determining that the correct LBA value has been identified. This does not, however, help to confirm whether the correct version of data has been retrieved.

Accordingly, FIG. 6 illustrates relevant portions of another storage device 150 to illustrate operation of the data integrity manager 130 of FIG. 4 in the context of a data write operation to write a selected block to memory. A verification code generator 152 of the data integrity manager generates a verification code (VC) which, for purposes of the current discussion, will constitute an IOEDC value as in FIG. 5. As noted previously, this is merely illustrative and not limiting as any number of different forms of verification codes can be generated and used as desired.

The IOEDC value is stored in a data integrity table 154, as well as forwarded to a data path processing module 156 (under the control of the main controller firmware 132, FIG. 4) that processes and ultimately stores the input data to a memory 158. In some cases, the IOEDC may also be stored to the memory 158. A metadata generator 160 generates metadata to describe the location and status of the stored data.

Figure 7:
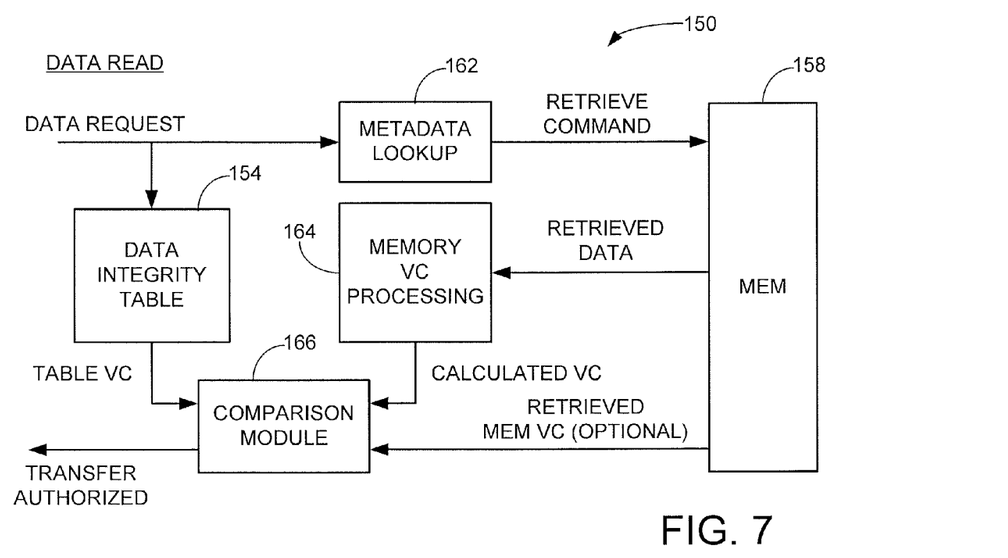
FIG. 7 is a functional block representation illustrating steps carried out by the data integrity manager during a data read operation.

FIG. 7 illustrates additional features of the storage device 150 of FIG. 6 during a subsequent read operation to return the stored data to a requesting host device. A data request is provided to a metadata lookup block 162, which (nominally) identifies the physical address (e.g., physical block address, PBA) at which the most current version of the data are stored. Data are retrieved from the identified location and forwarded to a memory verification code (VC) processing block 164, which generates a verification code ("Calculated VC") based on the retrieved data. The Calculated VC is generated using the same algorithm used to generate the initial VC (see e.g., FIG. 5). It is contemplated that block 164 is under control of the main controller firmware and may constitute a portion of the data path processing block 156 (FIG. 6).

The data request is also forwarded to the data integrity manager which retrieves the initial verification code ("Table VC") from the data integrity table 154 for the associated LBA. A comparison module 166 compares the Calculated VC with the Table VC, and, in some cases, also compares the verification code that was stored to the memory ("Retrieved MEM VC"). If the codes match, the transfer of the requested data is authorized.

In this way, the data integrity manager (130, FIG. 4) operates as an independent auditor of the normal device data path processing system. This provides two independent pieces of hardware/firmware that separately operate to validate the data. This independence ensures that a mismanagement in one portion of the system is detected by the other portion. It is contemplated that the data integrity manager will be closely coupled with the host logic, and will have access to a dedicated portion of the available DRAM memory (e.g., buffer 114 in FIG. 2).

Figure 8:
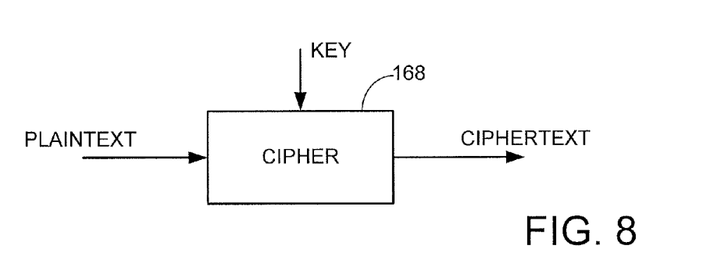
FIG. 8 is a cryptographic (cipher) block operative to generate a variety of verification codes for use by the data integrity manager.

While an IOEDC value has been disclosed as an example, any suitable algorithm can be used to generate the verification codes. FIG. 8 shows a general cipher block 168 that transforms input data ("plaintext") into output data ("ciphertext") using a selected algorithm (cipher). User data can be passed through the cipher block 168, and a portion of the output can be used as an IOEDC. An input key value, for instance the LBA, can be used as part of the transformation process. Any number of suitable ciphers can be used.

Figure 9:
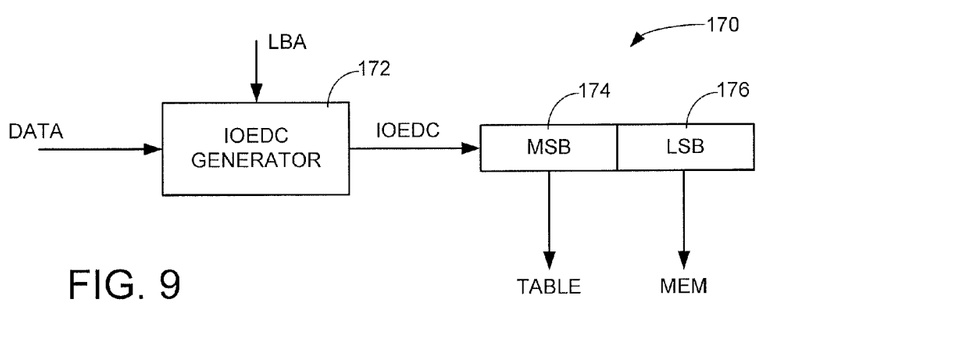
FIG. 9 illustrates the generation of an IOEDC value and storing different portions thereof in different memory locations within a storage device.

Another system is shown at 170 in FIG. 9 similar to those described above. The system 170 includes an IOEDC generator block 172 that generates a 2 byte IOEDC value responsive to the input data for a selected block and the associated LBA value. In the system 170, a first portion of the generated IOEDC value, such as the most significant byte (MSB) 174 (e.g., first 8 bits) is stored in the data integrity table 154.

A second portion of the generated IOEDC value, such as the least significant byte (LSB) 176 (e.g., last 8 bits) is stored in the memory 158. In this example, the entire IOEDC may be supplied to the data path processing block (156, FIG. 6), but only a portion is actually stored in the memory 158. In other embodiments, however, no portion of the IOEDC (or other generated verification code) is stored in the memory.

Figure 10:
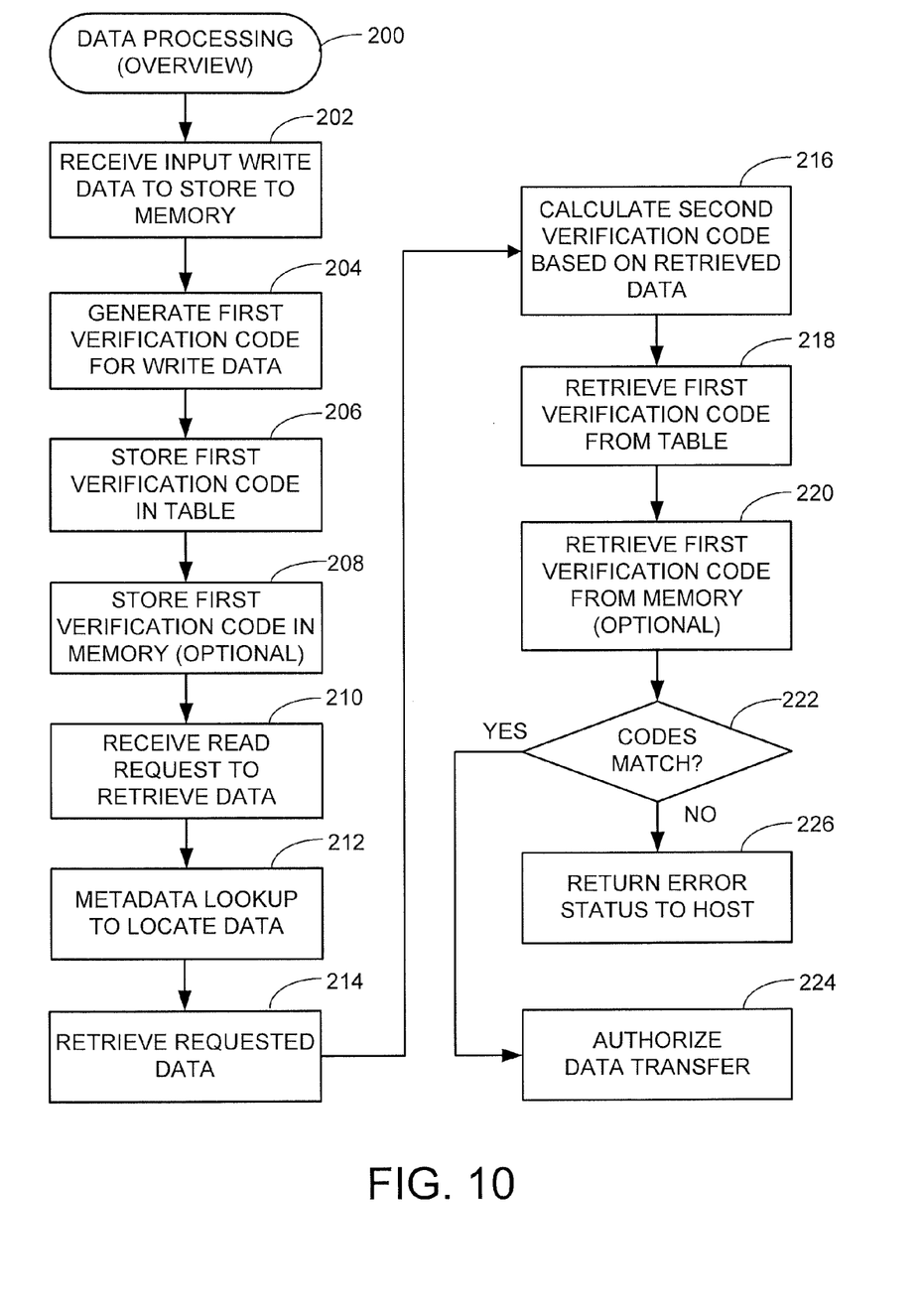
FIG. 10 is a flow chart for a data processing routine to provide an overview of steps carried out in accordance with various embodiments of the present disclosure.

FIG. 10 provides a flow chart for a data processing routine 200 to provide a summary of the foregoing discussion. For purposes of the present discussion, it will be contemplated that the routine 200 uses IOEDC values as generated in FIG. 5 during write and read operations as set forth by FIGS. 6-7. It will be appreciated that the routine 200 is merely exemplary and the various steps can be modified, appended, performed in a different order, etc.

Input data to be stored in memory are first received at step 202. The input data are arranged as one or more blocks each having an associated logical address (e.g., LBA). For each block, the block data and the LBA value are used to generate a first verification code (Table VC) for the input write data, step 204. The first verification code is stored in a table structure (such as the table 154), step 206. The first verification code, or a portion thereof, may additionally be stored in the memory (e.g., memory 158) along with the input write data after the application of suitable processing thereto, step 208.

A read request is subsequently received from a requesting host device to retrieve the previously stored data at step 210. At step 212, a metadata lookup operation (block 162, FIG. 7) identifies the physical location of where, as indicated by the system, the most current version of the data is stored. The data at the identified location (physical block address) are retrieved at step 214.

A second verification code (Calculated VC) is generated at step 216 using the retrieved data, such as described above by block 164 (FIG. 7). The first verification code (Table VC) is retrieved from the table at step 218, and, as desired, the stored verification code (Retrieved MEM VC) is retrieved from the memory at step 220.

A comparison operation is carried out as indicated by decision step 222. If the codes match, a data transfer operation is authorized as indicated at step 224. If one or more of the codes do not match, an error status is returned to the host, step 226. Alternatively or additionally, further corrective steps may be taken in the result of a code mismatch, including repeating the read operations, performing a new metadata search, recalculating one or more of the verification codes, etc.

FIGS. 11-18 provide details for a particular implementation of the data integrity scheme discussed above in accordance with some embodiments. It will be appreciated that the data structures and routines discussed herein can be readily adapted for a variety of environments and verification code formats.

Figure 11:
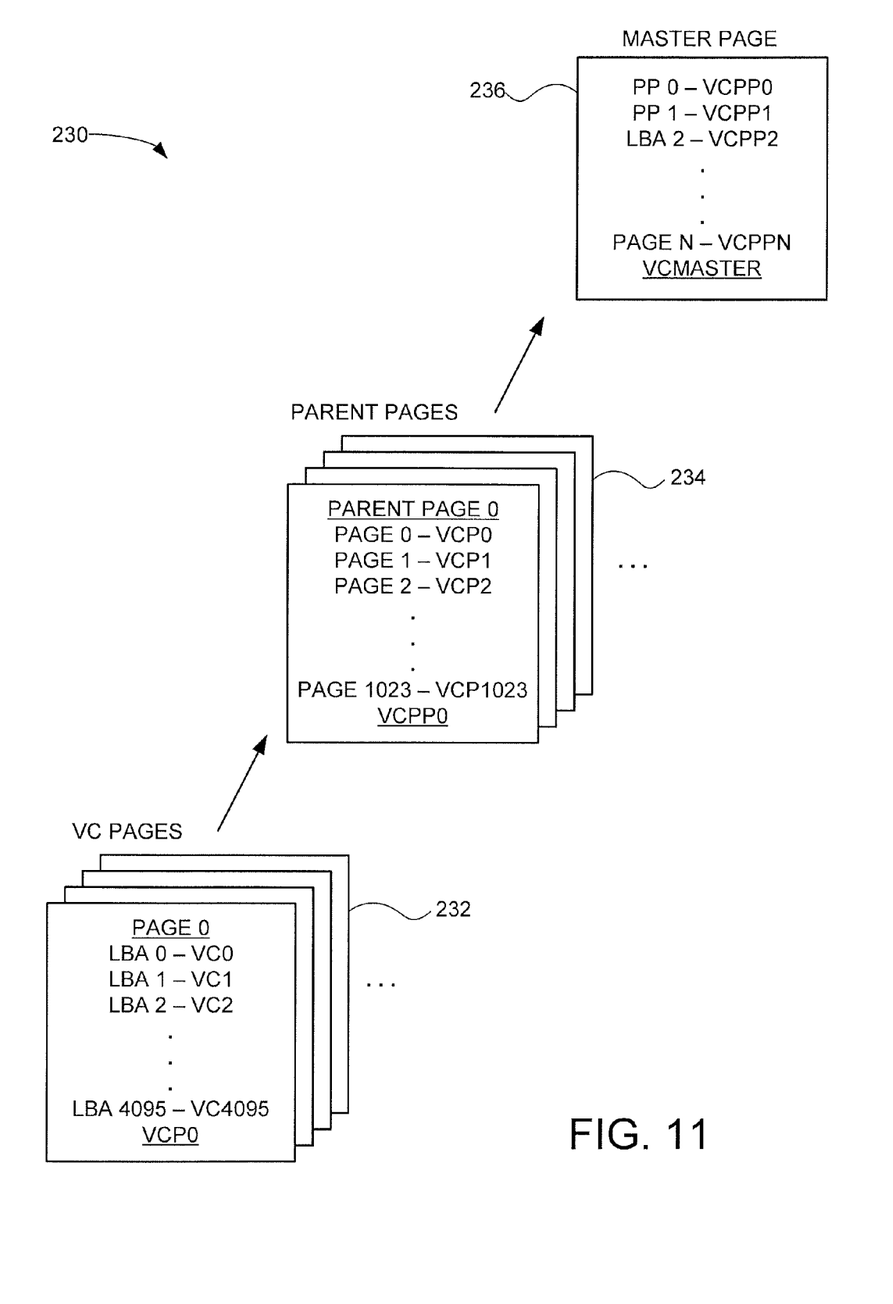
FIG. 11 shows an illustrative example for a verification table data structure in accordance with some embodiments.

FIG. 11 generally illustrates an exemplary data integrity table structure 230. The table structure 230 stores a single byte (8 bits) verification code for each LBA in the system, such as the MSB of a 16-bit IOEDC value as discussed above in FIG. 9.

Successive groups of LBAs are arranged into pages 232, such as successive groups of 4,096 LBAs. In this way, the first page (Page 0) stores verification codes for LBA 0 to LBA 4095, the second page (Page 1) stores verification codes for LBA 4096 to LBA 8191, and so on. For reference, the 8-bit verification code for LBA 0 is identified as VC0, the 8-bit verification code for LBA 1 is VC1, and so on. Because each verification code is a single byte (8-bits), it follows that the size of the contents of the entire page is 4096 bytes.

A page level verification code is generated to protect the contents of each page. The verification code for the first page (Page 0) is denoted as VCP0. Any suitable error detecting code algorithm, such as a CRC, can be used to generate the page level verification code. In some cases, the page level verification code takes the form of a Reed Solomon code so that the codes can detect and correct up to selected numbers of errors in the page contents. Other forms can be used. In one embodiment, the page level verification code is a 32-bit (4 byte) value.

The pages (including the page level verification codes) are stored in a suitable non-volatile memory, such as available flash memory, and retrieved to local volatile RAM as needed. EDC verifications can be automatically performed each time a page is loaded as explained below.

FIG. 11 further shows a number of parent pages 234. Each parent page accumulates the page level verification codes for an associated group of pages. In the example format of FIG. 11, each parent page stores the page level verification codes for 1,024 successive pages. The overall size of each parent page 234 (in terms of data capacity required to store the parent page) can be set to be nominally equal to the overall size of each page 232 (as in FIG. 11), or can be some other suitable size.

A parent page level verification code is generated for each parent page. For reference, the parent page level verification code for the first parent page (Parent Page 0) is denoted as VCPP0. As before, any suitable algorithm can be used to generate the parent page level verification codes, including but not limited to CRCs or Reed Solomon codes. As before, the parent page level verification codes may be adapted to enable the detection and correction of up to several detected bit errors. In one embodiment, the parent page level verification code is also a 32-bits (4 byte) word.

A master page is represented at 236. The master page 236 stores the parent page level verification codes for each of the parent pages. The master page 236 also concludes with an overall master EDC value (VCMaster). As before, the VCMaster is an EDC and may take the form of a CRC or Reed Solomon code or some other form. In one embodiment, the master EDC value is also a 32-bit (4 byte) word.

Each of the respective data structures are stored in non-volatile memory and loaded to volatile RAM as required. The respective hierarchy of EDC values ensure data integrity. To give an illustration, accessing a selected page, in this case Page 0, may involve retrieving the master page 236. The contents of the master page 236 are verified using the VCMaster code. This will validate all of the parent page level verification codes, including VCPP0, the verification code for Parent Page 0.

The parent page for the selected page (Parent Page 0) is next retrieved and verified using VCPP0. The verification can include comparing the retrieved value from the master page 236 to the retrieved value from the parent page. A new parent page level verification code can also be calculated based on the retrieved data and compared to the stored value in either or both the parent page and the master page.

Verification of the parent page (Parent Page 0) validates the page level verification code (VCP0) for the selected page (Page 0). The page 232 can then be retrieved and the validated code from the parent page can be compared to the retrieved (and/or calculated) code for the retrieved page.

Finally, the LBA for a given block can be identified (e.g., LBA 0) and the associated verification code (e.g., VC0) can be retrieved from the table structure and used as described above to verify the most current version of the data block is being returned to the host (see e.g., FIG. 10).

In sum, the lowest level (pages 232) each comprise 4096 bytes with each entry constituting a single byte (8 bits) of IOEDC data per LBA. The page level verification codes can be 4 byte (32-bit) EDC values, which are stored in the parent pages 234. While only a single intermediate level is shown between the individual pages 232 and the master page 236, any number of additional levels can be inserted as required.

Each 4 byte EDC from each parent page 234 is stored in the master page 236 and protected by a 4 byte EDC (VCMaster). It is contemplated that the master page is always preserved through power-loss, such as in non-volatile memory that is separate from the main mass storage memory (such as NOR flash, etc.).

It will be appreciated that the actual size of a given data integrity table will depend upon a variety of factors including block size and overall data capacity of the storage device. It is contemplated that the entire table can be loaded to available volatile DRAM and the master page will be small enough to fit in an available volatile SRAM or registers. Table 1 shows exemplary sizes for the various elements in FIG. 11 under different operational environments.

TABLE 1

| Drive Capacity | 512 GB | 512 GB | 1 TB | 1 TB | 4 TB | 4 TB |
|---|---|---|---|---|---|---|
| Block Size | 512 B | 4096 B | 512 B | 4096 B | 512 B | 4096 B |
| All VCs | 931 MB | 116 MB | 1863 MB | 233 MB | 7451 MB | 931 MB |

TABLE 1-continued

| Parent Pages | 931 KB | 116 KB | 1863 KB | 233 KB | 7451 KB | 931 KB |
|---|---|---|---|---|---|---|
| Master Page | 931 B | 116 B | 1863 B | 233 B | 7451 B | 931 B |

Other device data capacities and block sizes will provide corresponding values. Memory sizes shown in Table 1 are powers of 2, so that B=byte (8-bits), KB=1024 B, MB=1048576 B, etc. Drive Capacity refers to rated overall data storage capability of the device and does not take into account overprovisioning, spare blocks, etc. Block size is generally the size of individual blocks (sectors) from the host's perspective (e.g., number of user data bits associated with each LBA not including overhead processing bits, ECC bits, etc.). All VCs refers to the total storage capacity required to store all of the verification codes from the table structure. Parent pages is the total required storage capacity required to store all of the parent pages (234 in FIG. 11). Master page is the total required storage capacity required to store the master page (236 in FIG. 11).

It can be seen that the overall sizes of the data integrity data structure are reasonably manageable for a variety of different types of storage devices including SSDs, HDDs, hybrid drives, etc.

Under normal conditions, it is contemplated that at least the master page and each of the parent pages can be loaded to local RAM during initialization, verified as required, and maintained in RAM during system powered operation. Updates to the master page can be journaled so that changes from one revision to the next are tracked and stored in non-volatile memory. However, due to the relatively small size for the master page, it is contemplated that the entire updated page can be written to non-volatile memory upon loss of system power. A table of page dirty-bits can be maintained, and dirty data integrity pages can be scrammed to non-volatile memory upon power loss or rebuilt upon power recovery.

Depending upon block size and storage device capacity, the lowest pages (VC pages 232 in FIG. 11) can either all be maintained in volatile RAM during device operation, or loaded to RAM as required. Table structures can be rebuilt in response to detected errors. Recurring data integrity errors associated with the data integrity table structure can provide an indication of early failure reliability issues with the device, resulting in host notification for rebuild or replacement.

The data integrity manager can operate as a separate controller that communicates with the normal controller firmware (system controller). The movement of pages into and out of local DRAM memory can be carried out via commands issued to the system controller. The data integrity manager can be configured to communicate the target DRAM address of the page, the page number, and whether the operation is a write or a read. The system controller stores or fetches the requested page and communicates back to the data integrity manager. A media error that occurs when fetching a page is not a data integrity error, but does require a page rebuilding operation. If a particular page cannot be successfully rebuilt, all data covered by the failed page are forced into an unrecoverable state.

Figure 12:
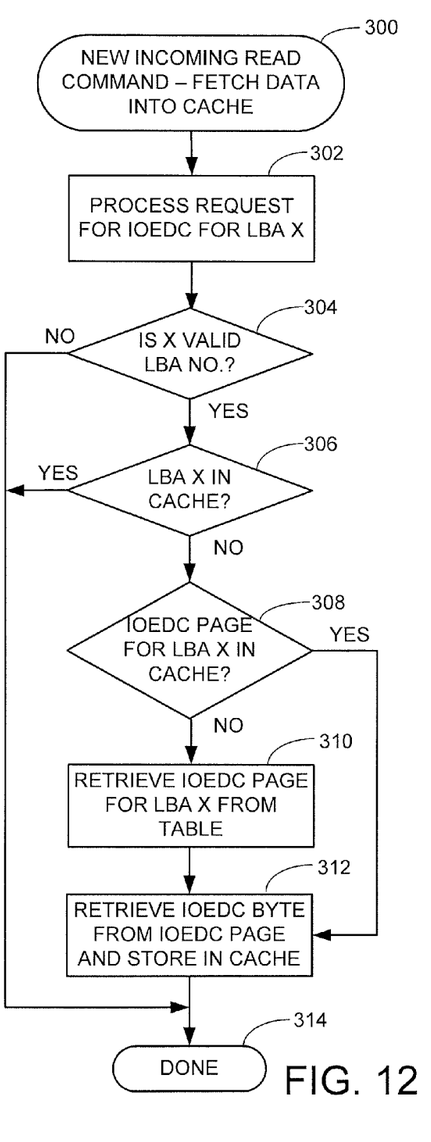
FIG. 12 is a flow chart for an incoming read command processing routine to illustrate steps carried out in accordance with some embodiments.

FIGS. 12-18 provide various detailed flow charts for routines carried out by a data integrity manager that uses a table structure such as 230 in FIG. 11. FIG. 12 is a flow chart for a routine 300 associated with the processing of a new incoming read command. The routine 300 generally operates to fetch and verify page data from the data integrity table for one or more associated LBAs (in this case, LBA X) in preparation for a comparison operation as described above.

The routine commences at step 302 wherein the data integrity manager (hereinafter "DIM") processes a request for the IOEDC value for LBA X. Decision step 304 determines whether X is a valid LBA number. If so, decision step 306 determines whether the block (LBA X) has been loaded into cache memory for processing by the DIM. Decision step 308 determines whether the IOEDC value for LBA X is already present in the local memory; if not, the page is retrieved at step 310. Thereafter, the IOEDC byte is retrieved and stored in the cache at step 312, and the process concludes at step 314.

Figure 13:
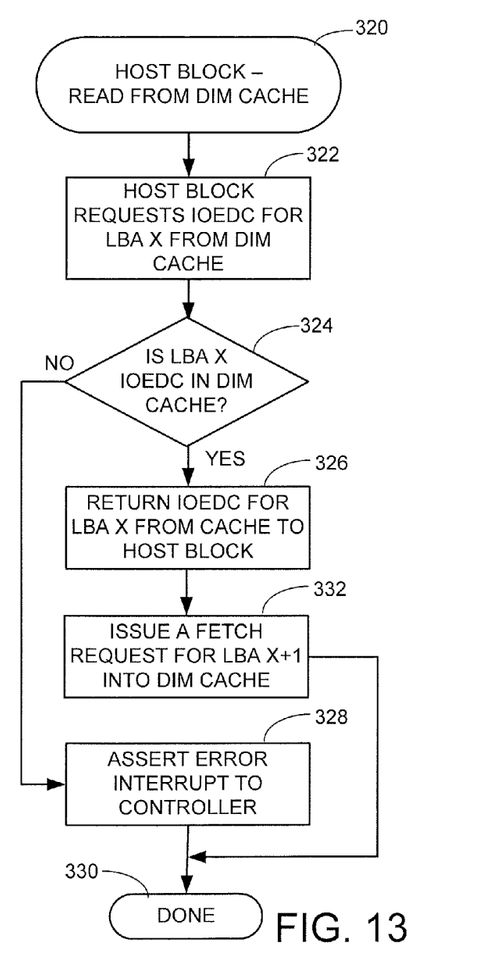
FIG. 13 is a flow chart for a cache access processing routine to illustrate steps carried out in accordance with some embodiments.

FIG. 13 is a routine 320 illustrating steps carried out as the TIM (also referred to as the "host block") accesses the data in TIM cache. At step 322, the host block requests the IOEDC byte for LBA X from the DIM cache. Decision step 324 determines whether the IOEDC byte for LBA X is loaded in the DIM cache. If so, the IOEDC byte is returned at step 326. A fetch request is issued at step 328 for the next LBA (e.g., LBA X+1), and this is processed in accordance with the routine 300 of FIG. 12, and the routine ends at step 330. However, if the IOEDC for LBA X is not loaded in DIM cache, the routine passes from decision step 324 to step 330 where an error interrupt is asserted.

Figure 14:
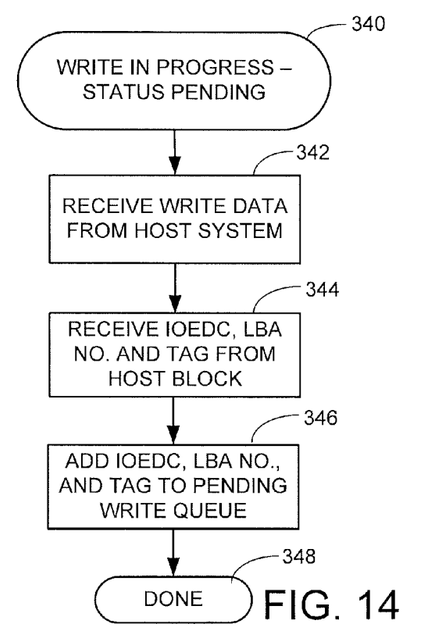
FIG. 14 is a flow chart for a write in progress processing routine to illustrate steps carried out in accordance with some embodiments.

FIG. 14 shows a routine 340 to indicate steps carried out during a write operation. Write data to be written to main memory are received at step 342. The IOEDC, LBA number and, as desired, an additional tag value are received at step 344, and these elements are appended to the pending write queue pending writing to the memory at step 346. The process then concludes at step 348.

Figure 15:
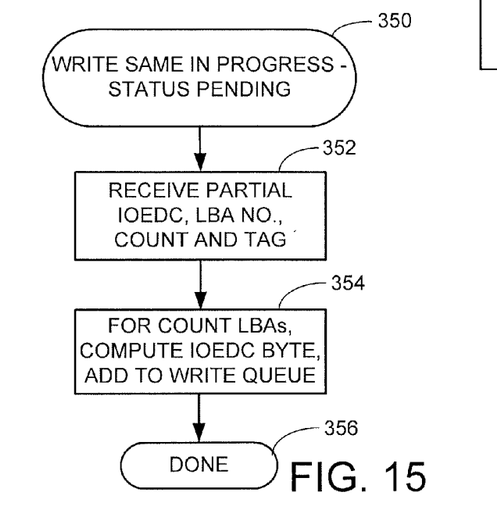
FIG. 15 is a flow chart for a write same routine processing to illustrate steps carried out in accordance with some embodiments.

FIG. 15 illustrates a routine 350 for steps during a write-same operation (e.g., an operation that repetitively writes the same user data to a number of sequential LBAs) applicable to a plurality of LBAs. Partial IOEDC (the EDC over the user data, e.g., 142 in FIG. 5), LBA number, LBA count and tag data are received at step 352. IOEDC bytes are generated for the counted LBAs and the generated IOEDC bytes are added to the write queue at step 354, after which the process ends at step 356.

Figure 16:
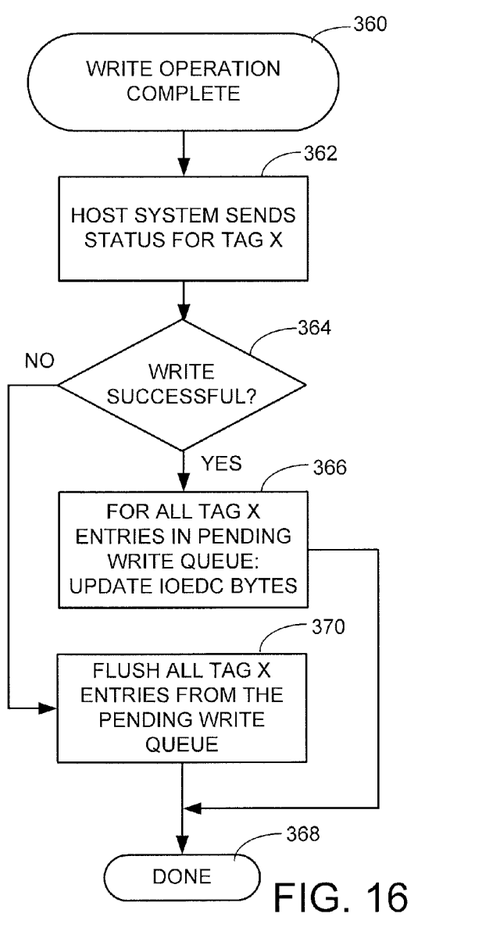
FIG. 16 is a flow chart for write operation complete processing routine to illustrate steps carried out in accordance with some embodiments.

FIG. 16 illustrates another routine 360 illustrating steps where the write (program) operation is completed (e.g., the input write data has been written to the memory) and a write complete status is forwarded to the host system. The host system sends a status for tag X (e.g., as generated at 344 FIG. 14) at step 362. Decision step 364 determines whether the write operation was successful. If so, the IOEDC bytes are updated for all entries in the pending write queue associated with the tag at step 366 and the process ends at step 368. Otherwise, if the write was not successful, all tag X entries are flushed from the pending write queue at step 370.

Figure 17:
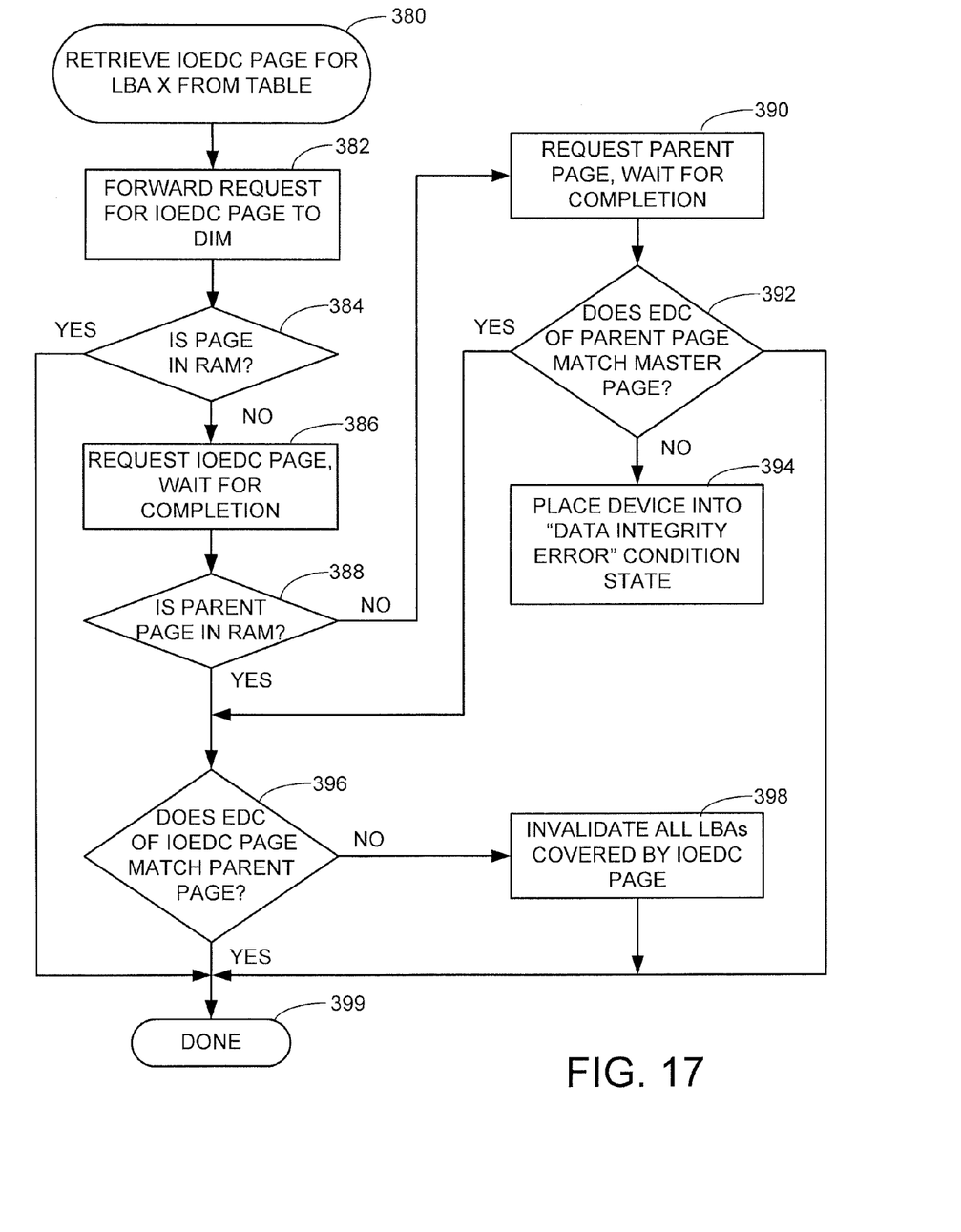
FIG. 17 is a flow chart for a table data retrieval routine to illustrate steps carried out in accordance with some embodiments.

FIG. 17 is a routine 380 to illustrate retrieval of the associated IOEDC page for a selected LBA (LBA X) from the data integrity table. A request for the IOEDC page is forwarded to the DIM at step 382. Decision step 384 determines whether the associated page is in local RAM memory. If not, the page is requested at step 386. Decision step 388 determines if the parent page for the LBA X is loaded to RAM. If not, a request for transfer of the parent page is carried out at step 390.

Decision step 392 provides a data verification check of the parent page data using the master page. If a mismatch occurs, a data integrity error condition is declared, step 394 and appropriate corrective actions are taken.

Once the parent page is successfully loaded to RAM, decision step 396 further performs a data verification check of the lowest level page data using the parent page. If a mismatch occurs, an error condition is declared, step 398, and appropriate corrective actions are taken including rebuilding the page data. On the other hand, if the lowest level page data is verified, the IOEDC value for LBA X is verified and available for use in revision level authentication, and the routine ends at step 399.

Figure 18:
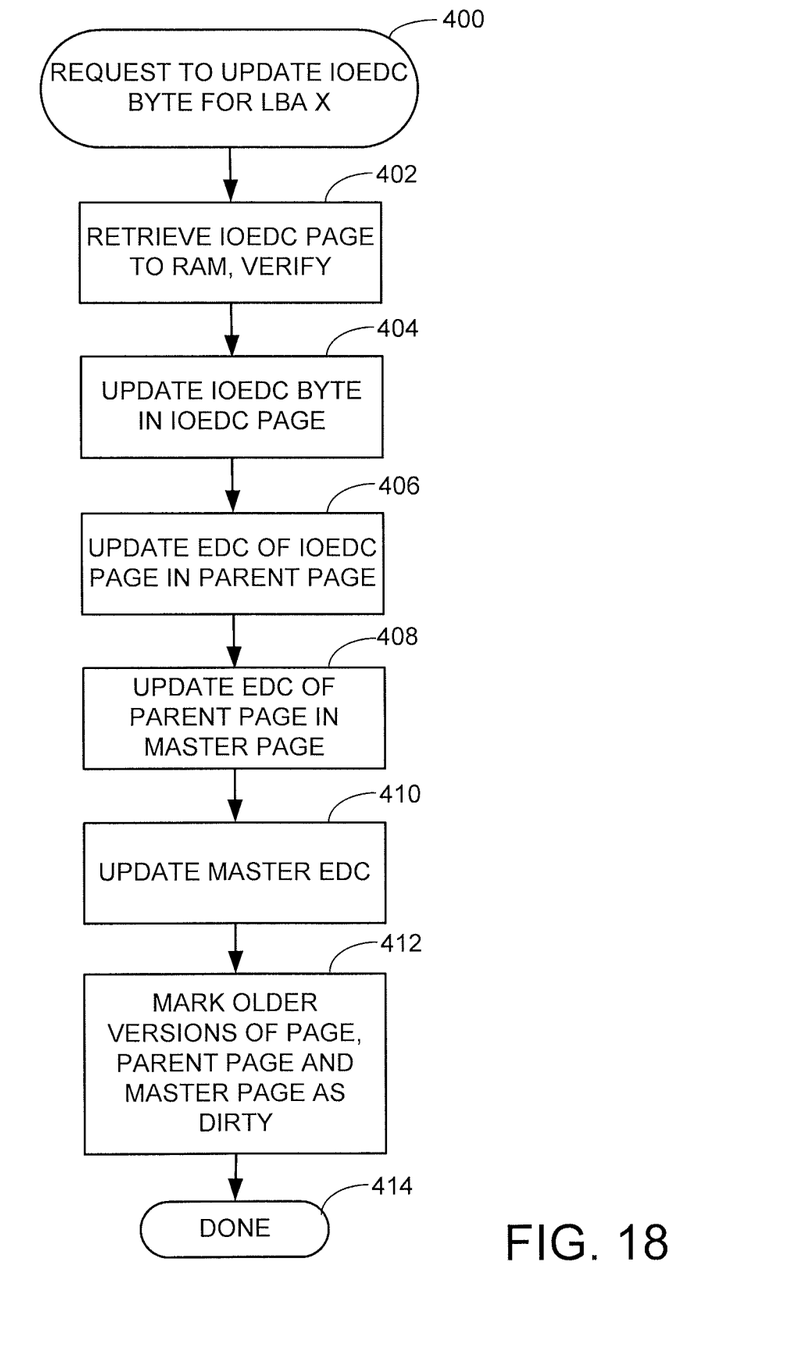
FIG. 18 is a flow chart for a data table updating routine to illustrate steps carried out in accordance with some embodiments.

FIG. 18 is a routine 400 for a request to update a given IOEDC byte (value) for LBA X. Such revision may occur, for example, as a result of a data write operation in which a newest version of the block data are written to main memory.

The routine includes steps of retrieving the current lowest level page from the table into RAM and, as desired, verifying the contents, step 402. The IOEDC byte for LBA X is next updated in the lowest level page, and the EDC for the lowest level page (page level verification code) is recalculated and stored at step 404.

The new page level verification code is written to the corresponding parent page and a new parent page level verification code is generated and also stored in the parent page at step 406. Similarly, the new parent page level verification code is written to the master page at step 408, and a new master EDC value for the master page is generated and stored at step 410. The older versions of the lowest level page, the parent page and the master page are thereafter marked as "dirty" (stale or older revision data), step 412, and discarded as appropriate.

Finally, it will be noted that at the initialization of a data storage device at the beginning of its useful life, the number of user data blocks provided by a host device may be relatively limited. In this state, both the main memory (e.g., the flash memory modules 116, 120, the disc memory 118, etc.) and the table structure in the local memory (e.g., the data integrity table 154, etc.) may be sparsely populated with user data blocks and corresponding verification codes, respectively.

In some cases, dummy data may be used to generate initial verification codes for the various lowest level pages 232, parent pages 234 and master page 236. Random or pseudo-random number generators can be employed to generate such dummy data, or a master set of "initial table values" may be loaded. Alternatively, bits storing the validity of the stored data may be kept in the verification code table. Manufacturing processing used during the qualification of the storage devices can be used to generate an initially populated table structure in the local memory that reflects the various "patterns" written to the individual physical locations in the main memory.

Regardless of the manner in which the data integrity table data structure is initially populated, it is contemplated that, as new user data are transferred to the main memory, valid user data block verification codes and corresponding page/master level verification codes will be generated and updated as required in real time. Each time the storage device is powered off, sufficient resources including backup power (standby batteries, capacitors, energy from rotating discs, etc.) will be provided to ensure the entire table structure or the most important portions thereof (e.g., master page and parent pages) are safely written to non-volatile memory (including to the main memory) to allow full and successful recovery upon device reinitialization.

While a variety of operational environments have been set forth in accordance with the forgoing embodiments, it will be appreciated that the disclosed subject matter can be adapted to substantially any form of memory and any form of operational environment, including hand-held devices, networked communication and transmission systems, mass storage systems, RAID (redundant arrays of independent discs) based systems, cloud computing environment, distributed object storage systems, etc.

It is to be understood that even though numerous characteristics and advantages of various embodiments of the present disclosure have been set forth in the foregoing description, this description is illustrative only, and changes may be made in detail, especially in matters of structure and arrangements of parts within the principles of the present disclosure to the full extent indicated by the broad general meaning of the terms wherein the appended claims are expressed.

What is claimed is:

1. An apparatus comprising:
a controller circuit which transfers blocks of user data between a host device and a main memory, each block of user data having an associated logical address; and
a data integrity manager circuit which generates and stores a verification code for each block of user data and which uses the verification code to independently verify a most current version of a selected block of user data has been correctly retrieved by the controller circuit from the main memory during execution of a host read request, the verification code for each block of user data generated by the data integrity manager circuit responsive to a user data content of said block and the associated logical address of said block and comprising non-overlapping first and second portions, the first portion of the verification code stored in a table structure in a local memory, the second portion of the verification code stored in the main memory and not in the table structure, the controller circuit transferring, across an interface, the most current version of the selected block to the host device responsive to the independent verification by the data integrity manager circuit.

2. The apparatus of claim 1, wherein a selected one of the first or second portions comprises a most significant byte (MSB) of the verification code, and wherein a remaining one of the first or second portions comprises a least significant byte (LSB) of the verification code.

3. The apparatus of claim 1, wherein the main memory is characterized as a virtually-mapped non-volatile memory so that each successively received version of a user data block having a common logical address is written to a new, different physical location within the main memory.

4. The apparatus of claim 1, wherein the main memory is at least a selected one of a flash memory or a rotatable magnetic recording media that uses partially overlapping data tracks.

5. The apparatus of claim 1, wherein the main memory is characterized as a rewriteable memory so that each successively received version of a user data block having a common logical address is nominally written to the same physical location within the memory.

6. The apparatus of claim 5, wherein the main memory is at least a selected one of a rotatable magnetic recording media with non-overlapping tracks, a spin-torque transfer random access memory (STRAM), a resistive random access memory (RRAM) or a ferromagnetic random access memory (FeRAM).

7. The apparatus of claim 1, wherein the main memory has an overall data storage capacity to accommodate N user data blocks having N corresponding logical block addresses (LBAs) where N is a plural number, wherein the table structure in the local memory is arranged by the data integrity manager circuit into a plural number M lowest level pages with each of the M lowest level pages storing the corresponding verification codes for a different sequential subset of the N LBAs, and wherein a page level verification code is generated by the data integrity manager circuit to provide error detection and correction (EDC) capabilities for the verification codes stored to each page.

8. The apparatus of claim 7, wherein the table structure in the local memory is further arranged by the data integrity manager circuit into a plural number P parent pages with each of the P parent pages storing the page level verification codes for a different sequential subset of the M lowest level pages, and wherein a parent page level verification code is generated by the data integrity manager circuit to provide EDC capabilities for the page level verification codes stored to each parent page.

9. The apparatus of claim 8, wherein the table structure in the local memory is further arranged by the data integrity manager circuit into a master page which stores the parent page level verification codes for each of the P parent pages, wherein a master verification code is generated by the data integrity manager circuit and incorporated into the master page to provide EDC capabilities for the parent page level verification codes stored to the master page.

10. The apparatus of claim 1, wherein the data integrity manager circuit independently verifies the most current version of the selected user data block is being retrieved by the controller circuit by retrieving the stored verification code from the table structure in the local memory, generates a new verification code responsive to the retrieved user data block from the main memory, and compares the retrieved verification code to the generated new verification code.

11. A method comprising:
receiving an input block of user data having an associated logical address for storage to a main memory;
generating a verification code responsive to a user data content of the input user data block and the associated logical address, the verification code having different first and second portions;
storing the first portion of the verification code in a table structure in a local memory and the second portion of the verification code in the main memory so that the second portion of the verification code is not stored in the table structure in the local memory;
storing the input user data block in the main memory;
subsequently receiving a host read request to retrieve the input user data block from the main memory;
retrieving the verification code from the table structure in the local memory;
using the retrieved verification code to independently verify a most current version of a selected user data block is being retrieved by a controller circuit from the main memory responsive to the host read request; and
transferring the verified most current version of the selected user data block to complete the host read request.

12. The method of claim 11, wherein using the retrieved verification code to independently verify the most current version of the selected user data block is being retrieved by the controller circuit from the main memory comprises generating a new verification code responsive to the retrieved user data block from the main memory, and comparing the retrieved verification code to the generated new verification code.

13. The method of claim 11, wherein the main memory has an overall data storage capacity to accommodate N user data blocks having N corresponding logical block addresses (LBAs) where N is a plural number, and wherein the method further comprises:
arranging the table structure in the local memory to include a plural number M lowest level pages with each of the M lowest level pages storing the corresponding verification codes for a different sequential subset of the N LBAs;
generating a page level verification code responsive to the verification codes stored to each page; and
using the page level verification code to authenticate the verification codes stored to each page.

14. The method of claim 13, further comprising:
arranging the table structure in the local memory to include a plural number P parent pages with each of the P parent pages storing the page level verification codes for a different sequential subset of the M lowest level pages;
generating a parent page level verification code responsive to the page level verification codes stored to each parent page; and
using the parent page level verification code to authenticate the page level verification codes stored to each page.

15. The method of claim 14, further comprising:
arranging the table structure in the local memory to include a master page which stores the parent page level verification codes for each of the P parent pages;
generating a master verification code responsive to the parent page level verification codes stored to the master page; and
using the master verification code to authenticate the parent page level verification codes stored to the master page.

16. The method of claim 11, wherein the verification code is characterized as an IOEDC (input/output error detection code) value formed by summing the user data content of the associated user data block and performing an exclusive-or (XOR) combination of the summed user data content with a logical block address (LBA) of the associated user data block.

17. A data storage device comprising:
a non-volatile main memory having a selected data storage capacity to accommodate N user data blocks having N corresponding logical block addresses (LBAs) where N is a plural number;
a controller circuit configured to direct a transfer of selected user data blocks between a host device and the main memory in response to host access requests from the host device;
a volatile local memory; and
a data integrity manager circuit configured to generate and store verification codes in a table data structure in the local memory, the table data structure arranged into a plural number M lowest level pages with each of the M lowest level pages storing a corresponding verification code for a different sequential subset of the N LBAs, the table structure further arranged into a plural number P parent pages with each of the P parent pages storing the page level verification codes for a different sequential subset of the M lowest level pages, the data integrity manager circuit further configured to retrieve and use the verification codes from the data table structure to independently verify a most current version of a selected block of user data has been correctly retrieved by the controller circuit from the main memory during execution of a host read request.

18. The data storage device of claim 17, wherein the data integrity manager circuit is further configured to generate a page level verification code to provide error detection and correction (EDC) capabilities for the verification codes stored to each page and to generate a parent page level verification code to provide EDC capabilities for the page level verification codes stored to each parent page, and wherein the controller circuit is further configured to transfer, across an interface, the most current version of the selected block to the host device responsive to the independent verification by the data integrity manager circuit.

19. The data storage device of claim 17, wherein the verification code for each block of user data is generated by the data integrity manager circuit responsive to a user data content of said block and the associated logical address of said block and comprising non-overlapping first and second portions, the first portion of the verification code stored in a table structure in a local memory, the second portion of the verification code stored in the main memory and not in the table structure.

20. The data storage device of claim 17, wherein the controller circuit and the data integrity manager circuit are characterized as a programmable processor having associated programming in a processor memory which is executed by the programmable processor.

* * * * *